United States Patent
Bertsche et al.

(10) Patent No.: US 7,176,468 B2
(45) Date of Patent: Feb. 13, 2007

(54) METHOD FOR CHARGING SUBSTRATE TO A POTENTIAL

(75) Inventors: Kirk J. Bertsche, San Jose, CA (US); Mark A. McCord, Los Gatos, CA (US)

(73) Assignee: KLA-Tencor Technologies Corporation, Milpitas, CA (US)

( * ) Notice: Subject to any disclaimer, the term of this patent is extended or adjusted under 35 U.S.C. 154(b) by 0 days.

(21) Appl. No.: 10/942,184

(22) Filed: Sep. 16, 2004

(65) Prior Publication Data

US 2006/0054815 A1    Mar. 16, 2006

(51) Int. Cl.
*H01J 37/244*    (2006.01)
(52) U.S. Cl. .................................. 250/399; 250/396 R
(58) Field of Classification Search ................ 250/397, 250/399
See application file for complete search history.

(56) References Cited

U.S. PATENT DOCUMENTS

| | | | | |
|---|---|---|---|---|
| 3,458,752 A | * | 7/1969 | Stowell | ....................... 315/372 |
| 4,415,851 A | * | 11/1983 | Langner et al. | ............. 324/501 |
| 5,045,705 A | * | 9/1991 | Mollenstedt | ................. 250/398 |
| 5,432,345 A | | 7/1995 | Kelly | |
| 5,973,323 A | * | 10/1999 | Adler et al. | ................. 250/310 |
| 5,986,263 A | * | 11/1999 | Hiroi et al. | ................. 250/310 |
| 5,990,476 A | * | 11/1999 | Larson et al. | ................ 250/251 |
| 6,066,849 A | * | 5/2000 | Masnaghetti et al. | ........ 250/310 |
| 6,734,429 B2 | * | 5/2004 | Takagi | .......................... 250/310 |
| 6,930,309 B1 | * | 8/2005 | Mankos et al. | .............. 250/310 |

* cited by examiner

*Primary Examiner*—David A. Vanore
(74) *Attorney, Agent, or Firm*—Okamoto & Benedicto LLP

(57) ABSTRACT

A surface of an insulating substrate is charged to a target potential. In one embodiment, the surface is flooded with a higher-energy electron beam such that the electron yield is greater than one. Subsequently, the surface is flooded with a lower-energy electron beam such that the electron yield is less than one. In another embodiment, the substrate is provided with the surface in a state at an approximate initial potential above the target potential. The surface is then flooded with charged particle such that the charge yield of scattered particles is less than one, such that a steady state is reached at which the target potential is achieved. Another embodiment pertains to an apparatus for charging a surface of an insulating is substrate to a target potential.

8 Claims, 6 Drawing Sheets

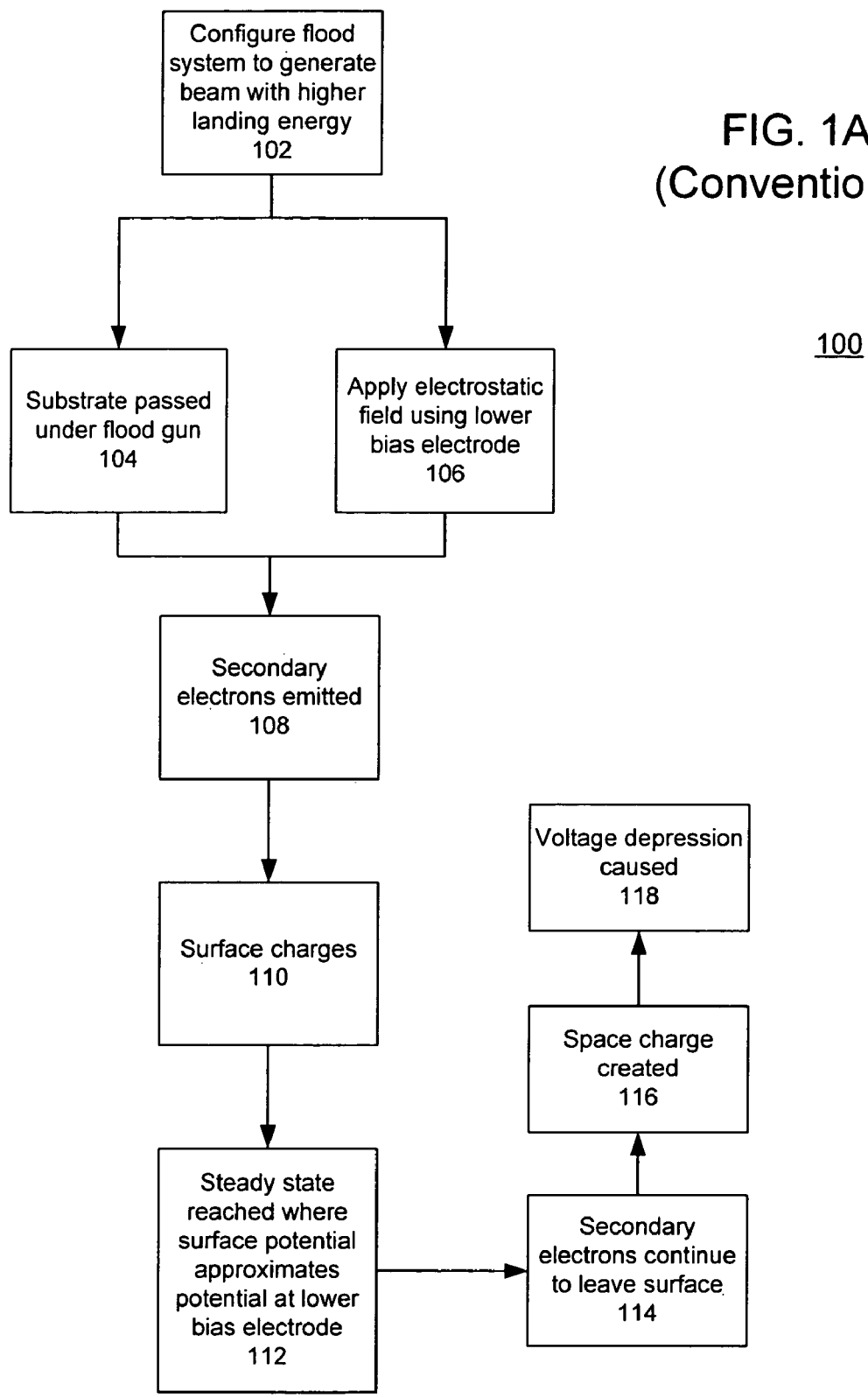
FIG. 1A
(Conventional)

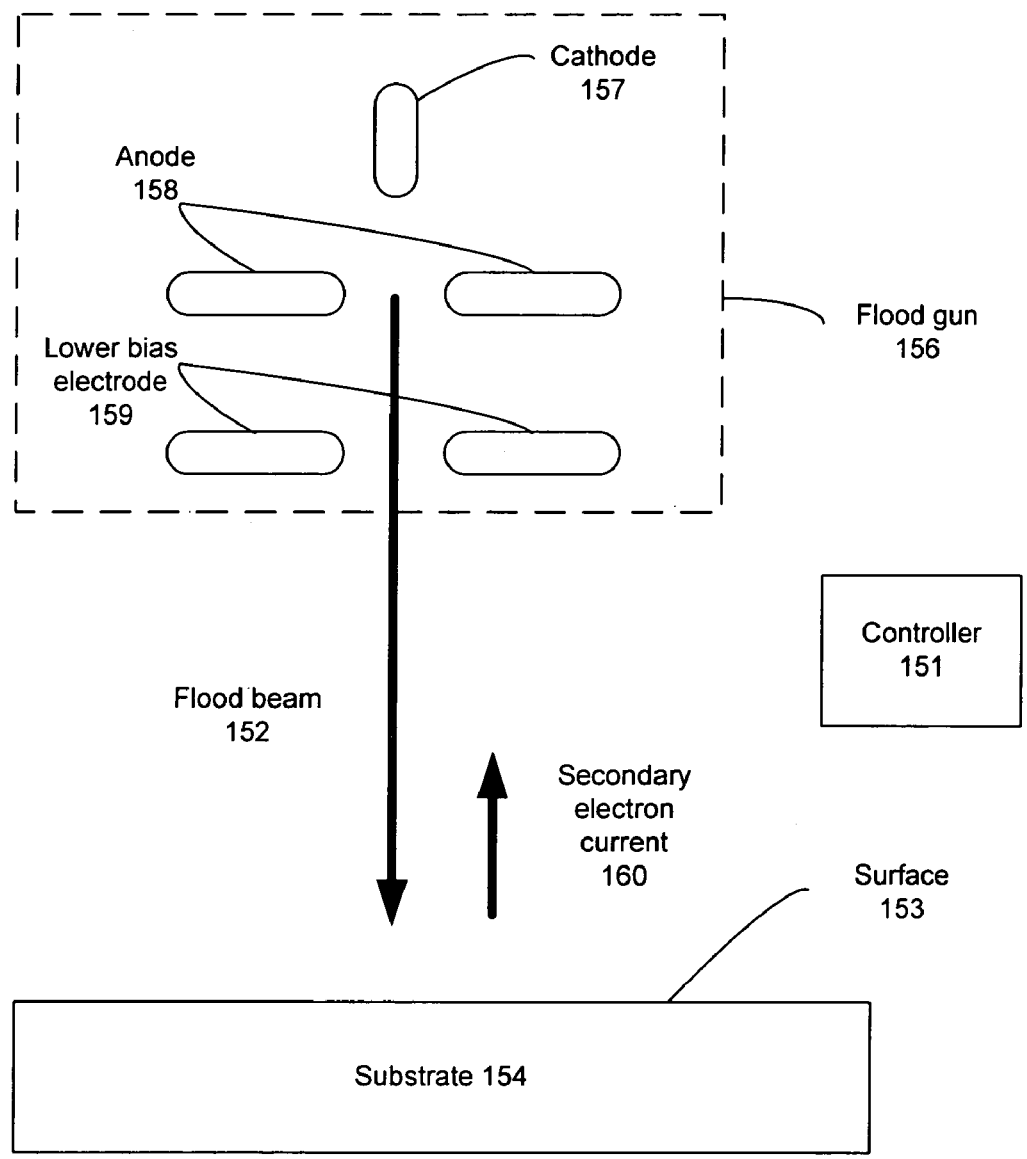
FIG. 1B
(Conventional)

200

METHOD FOR CHARGING SUBSTRATE TO A POTENTIAL

BACKGROUND OF THE INVENTION

1. Field of the Invention

The present invention relates to apparatus and methods for charging specimens to a potential.

2. Description of the Background Art

It is often desired to charge a non-conducting substrate to a known or uniform electrostatic potential. For example, this is often desired in a charged-particle instrument, such as an electron microscope, ion implanter, or other such instrument. One common application is the charging (or discharging) of a semiconductor wafer, especially with an insulating layer thereon. For example, the insulating layer may be silicon dioxide or another insulating material.

A common method for such charging utilizes electron flooding. The conventional technique for such electron flooding is now discussed in relation to FIGS. 1A and 1B. FIG. 1A is a flow chart depicting a method 100 of conventional flooding. FIG. 1B is a schematic diagram depicting a configuration for the conventional flooding in cross-section.

In the conventional flooding technique, the flood system is configured (102) to generate an electron flood beam 152 with a relatively high landing energy (typically, a few hundred electron volts) such that the electron yield is greater than one ($\eta>1$). The substrate 154 is passed (or is positioned) (104) under the electron flood gun 156, while an electrostatic field is simultaneously applied (106) above the substrate 154. The flood gun may include, among other components, a cathode 157, an anode 158, and a lower bias electrode 159. The electrostatic field may be applied, for example, using the lower bias electrode 159 around the flood gun 156 (and perhaps a grid in front of the flood gun). Secondary electrons 160 are emitted (108) from the surface 153 of the substrate 154 with very low energy (typically a few eV). These low energy secondary electrons 160 move under the influence of the electrostatic field, charging (110) the surface 153 until the electrostatic field is essentially neutralized. This results in a surface potential approximately equal to the potential of the lower bias electrode 159 of the flood gun 156. However, the potentials are not exactly equal because of space charge effects. When the surface charge reaches (112) a steady state, a secondary electron current 160 (equal to the incident flood beam current) continues to leave (114) the surface 153 of the substrate 154 and drift across the gap towards the lower bias electrode 158. These secondary electrons create (116) a space charge situation with a self-consistent field that drives the secondary electrons across the gap from the surface 153 to the flood gun bias electrode 158 and causes (118) a voltage depression at the surface of the substrate 154.

The following is a typical example of configuring (102) the system for conventional flooding of a semiconductor wafer with a layer of silicon dioxide on its surface. The configuration (102) may be performed using a controller 151 that is configured to control the various voltages applied in the system, such as the voltages on the electrodes in the flood gun 156 and the voltage applied to the substrate 154. The cathode 157 may be at a potential of negative three hundred volts (−300 V), and the anode 158 of the flood gun may be at the ground potential of zero volts (0 V), such that the electron flood beam has an energy of three hundred electron volts (300 eV). The voltage bias applied to the wafer substrate 154 (the wafer bias) may also be at electrical ground (0 V). Assuming that the potential at the wafer surface is not too far from the wafer bias, this would result in a landing energy of roughly three hundred electron volts (300 eV). If the substrate surface 153 is to be charged to approximately ten volts (10 V), then the lower bias electrode 159 of the flood gun 156 may be set to ten volts (10 V).

Unfortunately, as mentioned above, the conventional flooding typically causes (118) an unwanted voltage depression at the surface of the substrate 154. In a one-dimensional approximation, Child's Law may be used to calculate an approximation of the voltage depression. For example, given a one centimeter (1 cm) gap and an incident beam current density of one hundred microamperes per square centimeter (100 µA/cm$^2$), the space charge will depress the substrate by roughly twelve volts (12 V), according to a calculation using Child's Law.

In addition to the aforementioned voltage depression, variations in current density in the flood beam and at the beam edges will cause variations in substrate surface charge in the conventional flooding technique. Furthermore, there may be additional substrate potential errors due to voltage drops at the flood gun electrode (caused by resistivity and/or work function effects at the electrode). Moreover, there may be further substrate potential errors due to stray electric fields. In practice, these various voltage offsets give rise to charge variations of a few or several volts across the surface of a substrate. This makes it difficult to flood a substrate to a known or uniform potential with accuracy of better than a few volts.

SUMMARY

A surface of an insulating substrate is charged to a target potential. In one embodiment, the surface is flooded with a higher-energy electron beam such that the secondary electron yield is greater than one. Subsequently, the surface is flooded with a lower-energy electron beam such that the secondary electron yield is less than one.

In another embodiment, the substrate is provided with the surface in a state at an approximate initial potential above the target potential. The surface is then flooded with charged particles such that the charge yield of scattered particles is less than one, such that a steady state is reached at which the target potential is achieved.

Another embodiment pertains to an apparatus for charging a surface of an insulating substrate to a target potential. An electron flood gun includes a cathode, an anode, and a lower electrode. A substrate holder has a substrate bias voltage applied thereto. A controller controls the flood gun and the substrate bias voltage. The controller is configured to flood the surface of the substrate with a higher-energy electron beam such that the electron yield is greater than one. The controller is also configured to subsequently flood the surface with a lower-energy electron beam such that the electron yield is less than one.

BRIEF DESCRIPTION OF THE DRAWINGS

FIG. 1A is a flow chart depicting a method of conventional flooding.

FIG. 1B is a schematic diagram depicting a configuration for the conventional flooding.

DETAILED DESCRIPTION

As discussed above, it is often desired to charge a non-conducting substrate (such as, for example, a semiconductor wafer with an insulator layer thereon) to a known or uniform electrostatic potential. For example, this is often desired in a charged-particle instrument, such as an electron microscope, ion implanter, or other such instrument. To accomplish such substrate charging, the present application discloses operating an electron flood gun in a very different way than the conventional technique discussed above. Advantageously, the technique disclosed in the present application may essentially eliminate or substantially reduce voltage offsets due to the above-discussed effects of space charge, flood gun electrode potential, and/or stray electric fields.

Figure 2A:
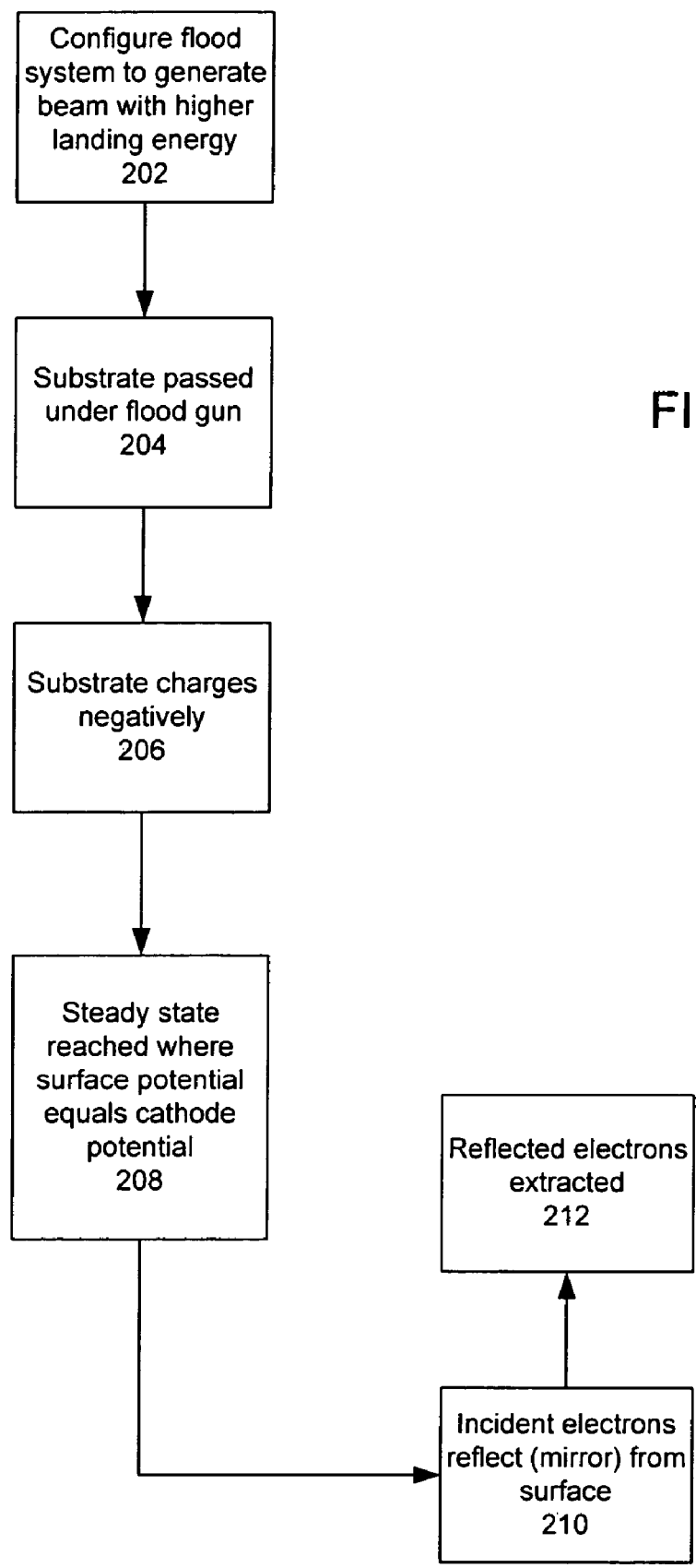
FIG. 2A is a flow chart depicting a method of mirror flooding in accordance with an embodiment of the invention.
Figure 2B:
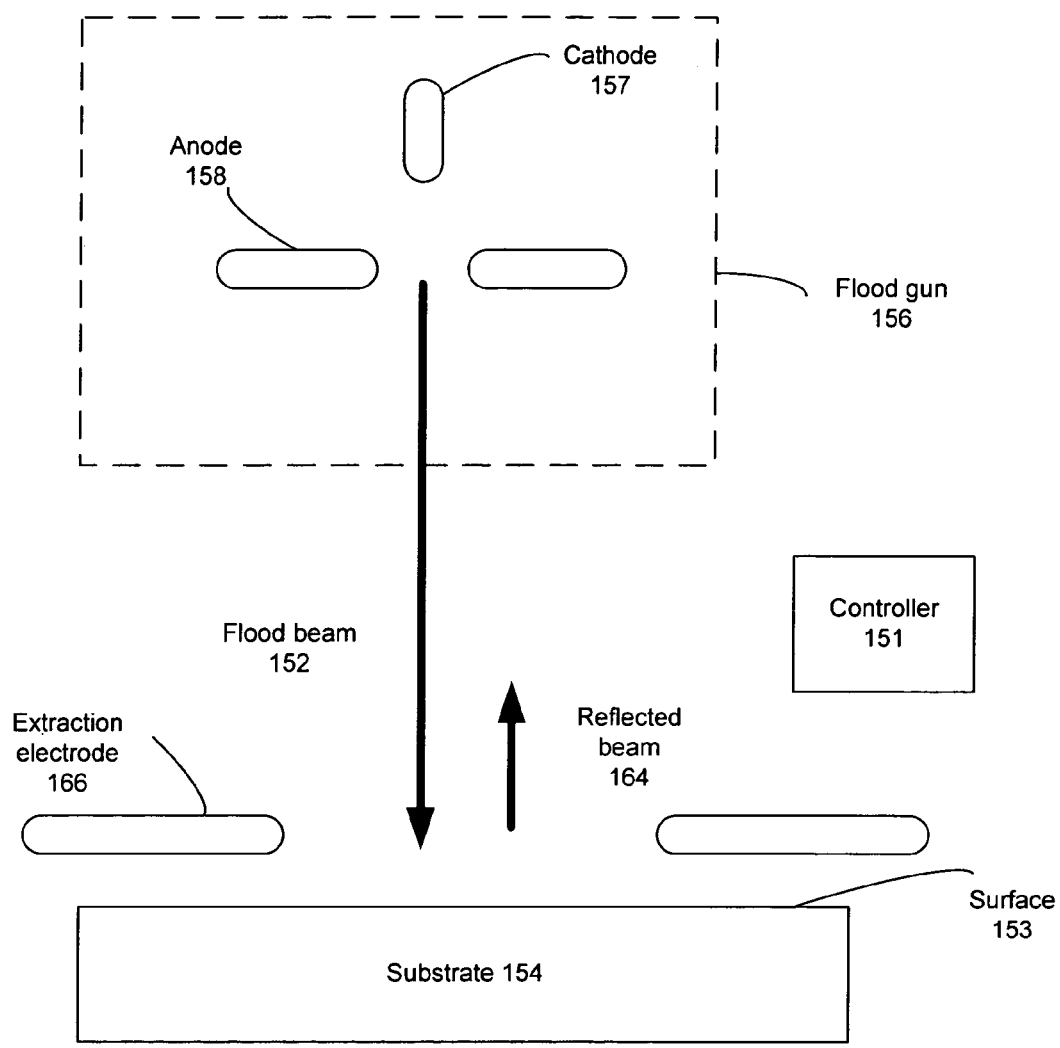
FIG. 2B is a schematic diagram depicting a configuration for mirror flooding in accordance with an embodiment of the invention.

One embodiment of the present invention relates to a mirror flooding technique that is quite different from the conventional flooding technique. The mirror flooding technique is now discussed in relation to FIGS. 2A and 2B. FIG. 2A is a flow chart depicting a method 200 of mirror flooding in accordance with an embodiment of the invention. FIG. 2B is a schematic diagram depicting a configuration for mirror flooding in cross-section in accordance with an embodiment of the invention.

In the mirror flooding technique, the electron flood beam 152 is configured (202) with a relatively low landing energy such that the electron yield is less than one ($\eta<1$). This is opposite to the conventional technique that purposely uses a relatively high landing energy so as to ensure an electron yield greater than one.

The substrate 154 is passed (or is positioned) (204) under the electron flood gun 156. In this charging mode, the surface 153 of the substrate 154 will charge (206) negatively (due to absorption of flooding electrons) until the surface 153 reaches the potential of the cathode 157 of the flood gun 156 (rather than to the approximate potential of the lower bias electrode 159 of the flood gun 156 in the conventional technique).

When a steady state is reached (208), the flood beam will not cause release of secondary electrons, but rather the incident electrons 152 from the flood beam reflect (mirror) (210) from the substrate surface 153 to create a reflected electron beam 164. An extraction electrostatic field configured above the substrate surface 153 using an extraction electrode 166 re-accelerates and extracts (212) the mirrored electrons relatively quickly, avoiding space charge effects. In this mirror mode, the substrate surface potential advantageously becomes relatively insensitive to potentials of the flood gun electrodes (other than the cathode 157).

The following is a specific example of configuring (202) the system for mirror flooding of the substrate surface. The configuration (202) may be performed using a controller 151 that is configured to control the various voltages applied in the system, such as the voltages on the electrodes in the flood gun 156, the voltage on the extraction electrode 166, and the voltage applied to the substrate 154. The cathode 157 may be set at a potential of negative one hundred volts (−100 V), and the anode 158 of the flood gun may be set at the ground potential of zero volts (0 V), such that the electron flood beam has an energy of one hundred electron volts (100 eV). If the wafer surface potential is to be lowered from a higher voltage to ten volts (10 V), then the voltage bias applied to the wafer substrate 154 (the wafer bias) may is be set at negative one hundred and ten volts (−110 V).

In order to assure that the electron yield is less than one during the above-discussed mirror flooding 200, the substrate charge should first be either known or controlled so that the flooding beam 152 nowhere strikes the surface 153 with an energy above $E_1$, defined as the electron energy at which the electron yield is equal to one.

If the surface charge state is unknown, then conventional flooding 100 may be first applied to achieve an approximately known voltage. The present application discloses two techniques combining the conventional and mirror flooding. One technique is a sequential method 300 and is discussed below in relation to FIG. 3. Another technique is a multiplexed or "chopped" method 400 and is discussed below in relation to FIG. 4.

Alternatively, multi-step mirror mode flooding may be used. For example, there are situations where an upper bound on the highest possible positive potential on a substrate may be known. Such an upper bound may be known based on the history of processing of the substrate or based on dielectric breakdown properties relating to the substrate. In that case, mirror mode flooding may be used first at a higher positive target potential, then at progressively lower target potentials, until the substrate is brought down closer to the target potential. For example, a wafer may have been inspected under electron extracting conditions, such- that the wafer becomes charged positively but in a nonuniform manner. For purposes of this example, assume that the wafer comprises an oxide layer that can be charged to 100 volts before breakdown, so that it is known that the upper bound to the potential of the substrate is +100 volts. Further assume that the target potential for the wafer is zero volts. In this case, the mirror mode flooding may be performed first with a target potential of +100 volts, followed by a mirror mode flooding at +67 volts, then at +33 volts, then at 0 volts.

Figure 3:
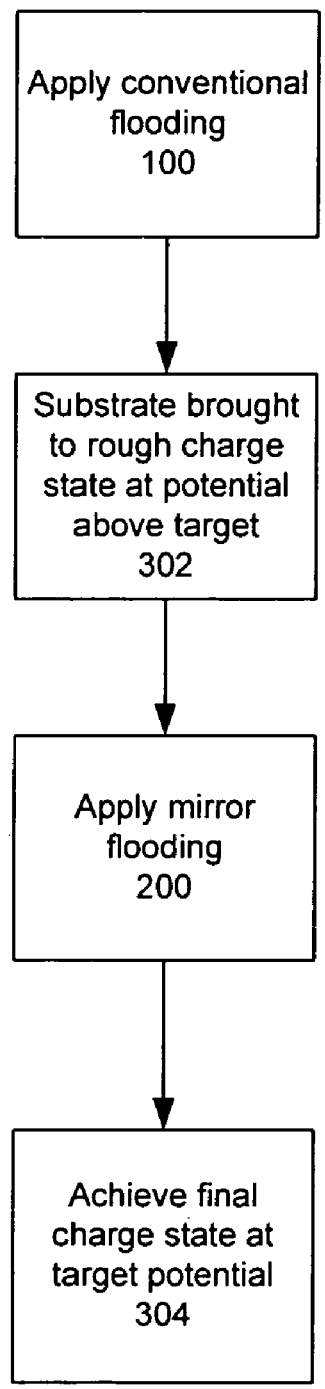
FIG. 3 is a flow chart depicting a sequential method of charging a substrate to a target potential in accordance with an embodiment of the invention.

FIG. 3 is a flow chart depicting the sequential method 300 of charging a substrate to a target potential in accordance with an embodiment of the invention. The method 300 of FIG. 3 may be applied to a substrate in an unknown charge state. The method 300 includes two stages.

The first stage involves a conventional flooding process (100) to bring (302) the substrate to an approximate (rough) charge state. One embodiment of a conventional flooding process (100) is described above in relation to FIG. 1A and 1B.

The second stage involves a mirror flooding process (200) to achieve (304) a final (fine) charge state. One embodiment of a mirror flooding process (200) is described above in relation to FIGS. 2A and 2B.

For example, the conventional flooding process (100) may be used to charge the substrate to a few tens of volts above the final target voltage. Then, the mirror flooding process (200) may be used to provide negative charging to lower the potential to the final target voltage.

In a specific example, suppose that a semiconductor wafer with a layer of silicon dioxide thereon is desired to be charged to a potential of ten volts (10 V). First, the wafer may be conventional flooded (100). The conventional flooding may be accomplished, for example, using the following configuration (102). The cathode 157 may be set at a potential of negative three hundred volts (−300 V), and the anode 158 may be set at the ground potential of zero volts (0 V), such that the electron flood beam has an energy of three hundred electron volts (300 eV). The voltage bias applied to the wafer substrate 154 (the wafer bias) may also be at electrical ground (0 V). The beam energy is high enough such that the landing energy should result in an electron yield greater than one. The lower bias electrode 159 of the flood gun 156 may be set to thirty volts (30 V) such that the wafer surface becomes charged to roughly thirty volts. This charging to 30 V is only rough because of the aforementioned voltage depression and other voltage variations. Second, the wafer may be mirror flooded (200). The mirror flooding may be accomplished, for example using the following configuration (202). The cathode 157 may be set at a potential of negative one hundred volts (−100 V), and the anode 158 of the flood gun may be set at the ground potential of zero volts (0 V), such that the electron flood beam has an energy of one hundred electron volts (100 eV). If the wafer surface potential is to be lowered from the roughly thirty volts (30 V) to ten volts (10 V), then the voltage bias applied to the wafer substrate 154 (the wafer bias) may be set at negative one hundred and ten volts (−110 V). The final result is that the surface of the wafer is set to 10 V with improved accuracy over the conventional flooding technique.

Figure 4:
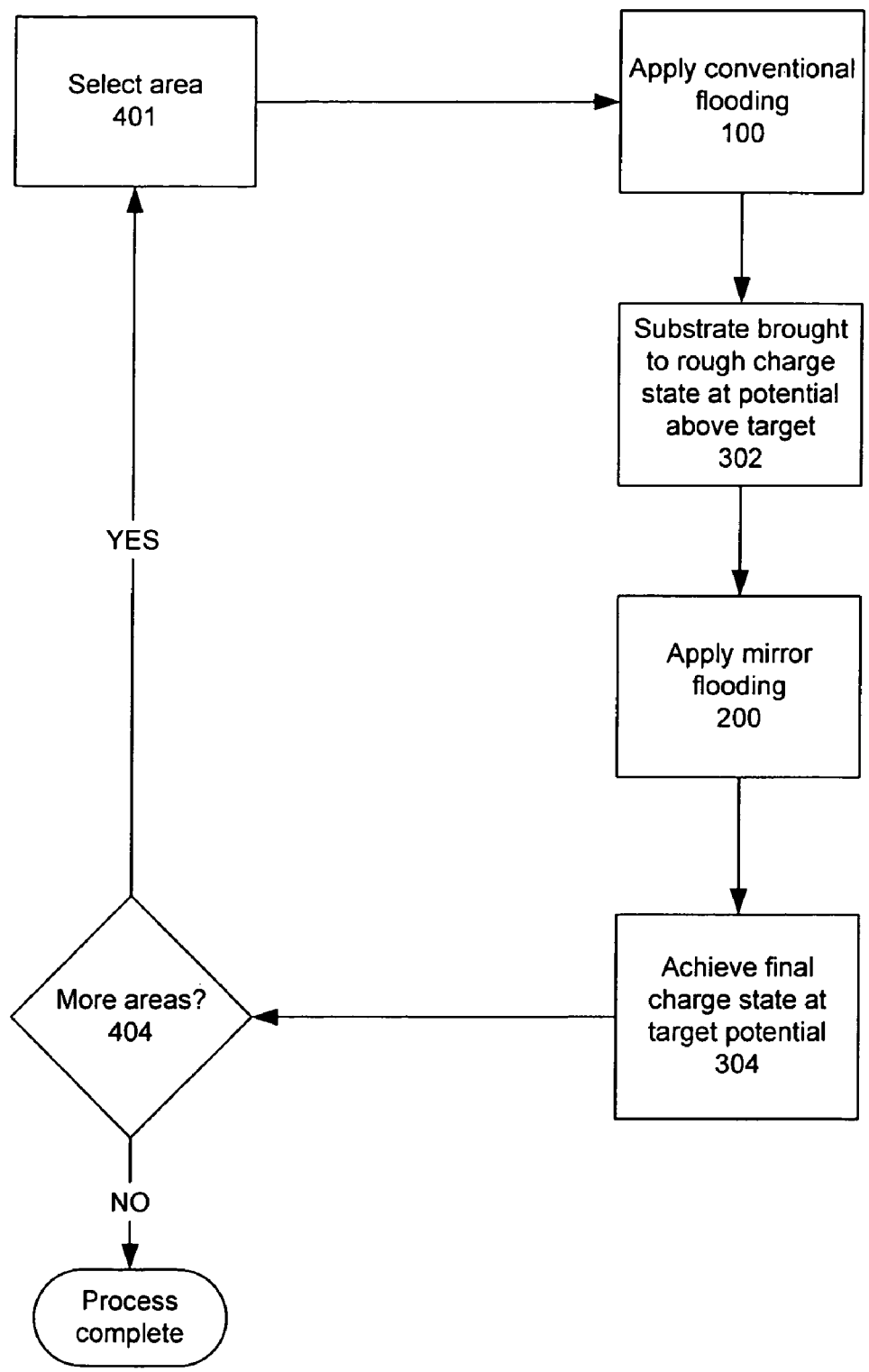
FIG. 4 is a flow chart depicting a multiplexed method of charging a substrate to a target potential in accordance with an embodiment of the invention.

FIG. 4 is a flow chart depicting a multiplexed or "chopped" method 400 of charging a substrate to a target potential in accordance with an embodiment of the invention. In this method 400, the surface 153 of the substrate 154 is covered area by area, rather than all at once. Each area selected (401) may be exposed to one or more cycles, where each cycle includes conventional flooding (100) to bring about (302) a rough charge state, followed by mirror flooding (200) to achieve (304) a final charge state at the target potential.

While there are more areas to be covered (404), the next area is selected (401) and the flooding process (100/302/ 200/304) is moved to that area. When all the areas are covered (404), then the process is complete. The movement to cover the desired surface area can either be in a step-wise fashion or a continuous motion (swathing).

In the above description, numerous specific details are given to provide a thorough understanding of embodiments of the invention. However, the above description of illustrated embodiments of the invention is not intended to be exhaustive or to limit the invention to the precise forms disclosed. One skilled in the relevant art will recognize that the invention can be practiced without one or more of the specific details, or with other methods, components, etc. In other instances, well-known structures or operations are not shown or described in detail to avoid obscuring aspects of the invention. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined by the following claims, which are to be construed in accordance with established doctrines of claim interpretation.

What is claimed is:

1. A method of controllably charging a surface of an insulating substrate to a predetermined target potential, the method comprising:

applying a first bias voltage to a cathode of an electron gun and a second bias voltage to the substrate so as to achieve a higher-energy electron beam having a first landing energy that is sufficiently high so that an electron yield is greater than one;

applying a third bias voltage to a lower bias electrode of the electron gun to create an electrostatic field above the surface, wherein the third bias voltage is more positive than the predetermined target potential;

flooding the surface with the higher-energy electron beam so that the surface of the substrate charges to a first steady state potential at approximately the third bias voltage;

subsequently setting the first bias voltage to the predetermined target potential and reducing a voltage difference between the first bias voltage and the second bias voltage, the voltage difference being reduced so as to achieve a lower-energy electron beam having a second landing energy that is sufficiently low so that the electron yield is less than one;

flooding the surface with the lower-energy electron beam so that the surface of the substrate charges negatively to a second steady state potential at the predetermined target potential, wherein incident electrons from the electron gun are reflected by the surface when the predetermined target potential is reached; and applying a fourth bias voltage to an extraction electrode near the surface of the substrate during flooding by the lower-energy electron beam so as to extract said reflected electrons from a vicinity above the surface.

2. The method of claim 1, further comprising:

covering the surface sequentially by the higher-energy beam flooding and then by the lower-energy beam flooding.

3. A process of charging a surface of an insulating substrate to a predetermined target potential, the process comprising:

applying a first bias voltage to a cathode of a charged-particle gun and a second bias voltage to the substrate so as to achieve a higher-energy charged-particle beam having a first landing energy that is sufficiently high so that a charge yield of scattered particles is greater than one;

applying a third bias voltage to a lower bias electrode of the charged-particle gun;

performing a first flooding process with the higher-energy charged-particle beam to provide the substrate with the surface in a state at an approximate initial potential above the predetermined target potential;

after the first flooding process, setting the first bias voltage to the predetermined target potential and reducing a voltage difference between the first bias voltage and the second bias voltage, the voltage difference being reduced so as to achieve a lower-energy charged-particle beam having a second landing energy that is sufficiently low so that the charge yield of scattered particles is less than one;

performing a second flooding process with the lower-energy charged-particle beam to reach a steady state at which the surface achieves the predetermined target potential; and applying a fourth bias voltage to an extraction electrode during the second flooding process.

4. The process of claim 3, wherein the charged particles comprise electrons, and the scattered particles comprise scattered electrons.

5. The process of claim 3, wherein, at the steady state, the charged particles flooding the substrate are reflected from the substrate.

6. The process of claim 3, wherein the first flooding process is performed using electron beam flooding with an electron yield greater than one.

7. The process of claim 3, wherein the first flooding process is performed using ion beam bombardment.

8. The process of claim 3, wherein the insulating substrate comprises an insulating layer on a semiconductor wafer.

* * * * *